United States Patent [19]

Watanabe et al.

[11] 4,169,247

[45] Sep. 25, 1979

[54] GAIN CONTROL CIRCUIT IN COMBINATION WITH A DIFFERENTIAL AMPLIFIER

[75] Inventors: Yasuaki Watanabe; Yukio Okabe, both of Yokohama, Japan

[73] Assignee: Victor Company of Japan, Limited, Japan

[21] Appl. No.: 909,702

[22] Filed: May 25, 1978

[30] Foreign Application Priority Data

May 30, 1977 [JP] Japan .................................. 52/63047
May 31, 1977 [JP] Japan .................................. 52/63483

[51] Int. Cl.$^2$ ......................... H03F 3/45; H03G 3/10
[52] U.S. Cl. .................................................. 330/254
[58] Field of Search ..................... 330/69, 254; 358/27

[56] References Cited

U.S. PATENT DOCUMENTS

| | | | |
|---|---|---|---|
| 2,930,982 | 3/1960 | Patterson | 330/69 |
| 3,210,683 | 10/1965 | Pay | 330/69 |
| 3,310,688 | 3/1967 | Ditkofsky | 330/69 X |

OTHER PUBLICATIONS

Ritter, "Controlling Op Amp Gain with One Potentiometer", *Electronics*, Jul. 31, 1972, p. 78.
Hoffait et al., "Nanovolt Transistor DC Amplifiers", *Proceedings of the IEEE*, Aug. 1963, p. 1147.

*Primary Examiner*—James B. Mullins
*Attorney, Agent, or Firm*—Lowe, King, Price & Becker

[57] ABSTRACT

Two terminals of a variable resistor are respectively connected via resistors to bases of two transistors which constitute an input stage of a differential amplifier while the movable contact of the variable resistor is fed with a predetermined voltage. Either the resistance of the variable resistor with respect to the resistances of fixed resistors connected to the bases or the ratio between the fixed resistors is so selected that the variation of the maximum resistance of the variable resistor does not influence the relationship between the position of the movable contact and the gain of the differential amplifier.

8 Claims, 5 Drawing Figures

FIG. 1 PRIOR ART
FIG. 2
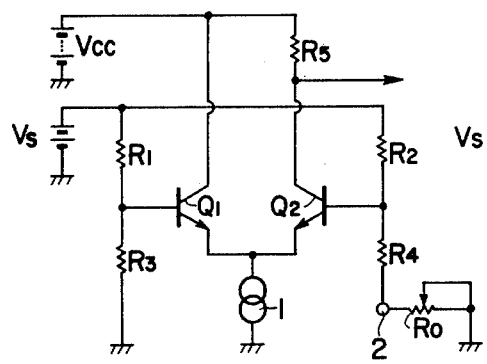
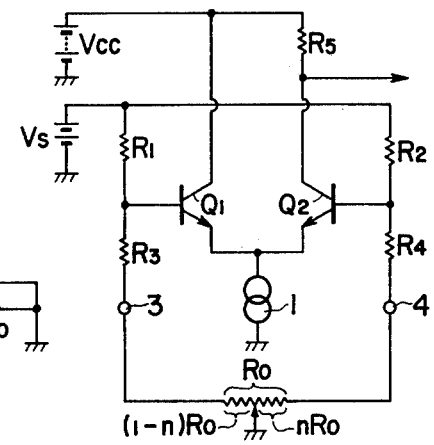
FIG. 3
FIG. 4
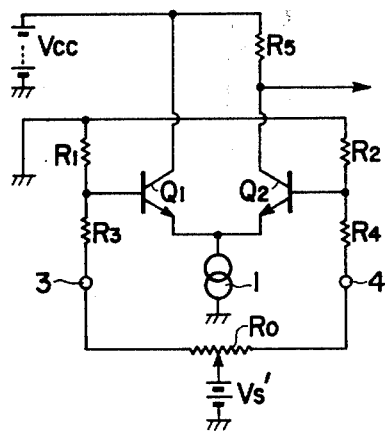
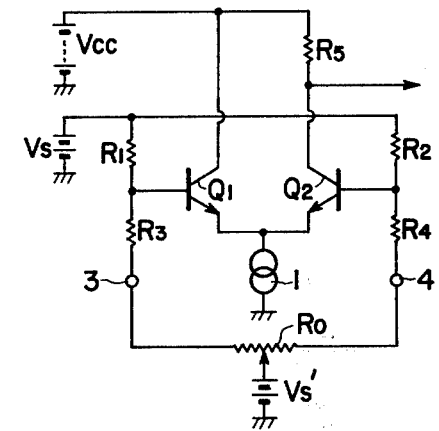
FIG. 5
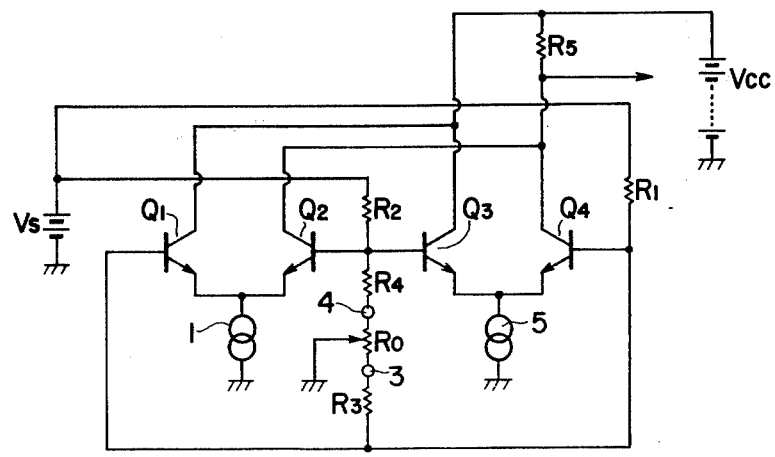

GAIN CONTROL CIRCUIT IN COMBINATION WITH A DIFFERENTIAL AMPLIFIER

FILED OF THE INVENTION

This invention generally relates to a gain control circuit of an amplifier. More specifically the present invention relates to a gain control circuit for a differential amplifier.

BACKGROUND OF THE INVENTION

A differential amplifier including two active elements such as transistors and field effect transistors (FET) are generally utilized in an first (input) stage of an operational amplifier incorporated in an integrated circuit (IC). In such a differential amplifier, a variable resistor is interposed via a fixed resistor between a control electrode such as a base terminal of a transistor and ground for controlling the gain of the differential amplifier. The control electrode is connected via another fixed resistor to a power supply so that two fixed resistors and the variable resistor function as a voltage divider wherein the voltage at the control electrode is variable in accordance with the change of the resistance of the variable resistor. As the variable resistor a rotational type or a slidable type is usually employed. The variable resistor is operated by an operator or a user of the amplifier in order to control the gain of the amplifier, by means of changing the position of the movable (rotatable or slidable) contact thereof.

Assuming the resistance of the first fixed resistor which is interposed between the power supply and the control electrode Ra, the resistance of the second resistor interposed between the control electrode and one terminal of the variable resistor Rb and the resistance between the terminal and a movable contact of the variable resistor Rc, the voltage Vb at the control electrode is obtained by the following equation:

$$Vb = \frac{Rb + Rc}{Ra + Rb + Rc} Vs$$

wherein Vs is a voltage of the power supply.

Usually the ratio of the first and second resistances Ra and Rb has $\pm 1 \sim \pm 5\%$ variation, if these fixed resistors are made on an IC chip. Therefore, in order to obtain a predetermined voltage at the control electrode by setting the movable contact of the variable resistor at a predetermined position, the maximum resistance of the variable resistor must be selected so as to compensate for the variations of the ratio between the fixed resistors. Further in order to obtain a predetermined gain by a differential amplifier, the voltage at the control electrode of the other active element should be at a predetermined voltage. When all of these requirements are fulfilled, the gain of the differential amplifier exactly corresponds to the position of the movable contact of the variable resistor.

However, variable resistors usually have a considerable variation in maximum resistances because of mass production. The maximum resistances of variable resistors vary within as much as $\pm 30\%$ of the rated resistance. Therefore, the deviation of the bias voltage at the control electrode from a predetermined value which corresponds to a predetermined position of the movable contact is apt to be undesirably large. This means even though the resistances of the fixed resistors are within narrow variation limits, any given gain obtained by a conventional type of gain control circuit in combination with a differential amplifier does not correspond to any one predetermined position of the movable contact of the variable resistor.

Because of the above mentioned reason it has, until now, been extremely difficult to construct a practical gain control circuit for differential amplifiers in which the amplifier to amplifier variation of the gain, obtained by setting the variable resistor in any one set or predetermined position, is negligible.

SUMMARY OF THE INVENTION

The present invention has been developed in order to overcome above mentioned drawbacks of the conventional type of gain control circuits for differential amplifiers.

According to the present invention, a variable resistor having two terminals and a movable contact is interposed via fixed resistors between two control electrodes of first and second active elements such as transistors where the movable contact thereof is fed with a predetermined potential. With this provision, the gain of the differential amplifier is controlled by moving the movable contact where the deviation in resistance from a rated resistance of the variable resistor does not influence the variation of the gain. In order to achieve the above mentioned feature of the present invention, the maximum resistance of the variable resistor with respect to fixed resistors connected to the control electrodes of the active elements or the ratio between the resistances of the fixed resistors is predetermined.

It is therefore, an object of the present invention to provide an improved gain control circuit for a differential amplifier in which variation in maximum resistance of a variable resistor for controlling the gain does not influence the variation of the gain of the circuit.

BRIEF DESCRIPTION OF THE DRAWINGS

The object and features of the present invention will be readily apparent from the following detailed description taken in conjunction with accompanying drawings in which:

FIG. 1 shows a conventional type of a gain control circuit in combination with a differential amplifier;

FIG. 2 shows a first preferred embodiment of a gain control circuit in combination with a differential amplifier according to the present invention;

FIG. 3 shows a second preferred embodiment of a gain control circuit in combination with a differential amplifier according to the present invention;

FIG. 4 shows a third preferred embodiment of a gain control circuit in combination with a differential amplifier according to the present invention; and FIG. 5 shows a fourth preferred embodiment of a gain control circuit in combination with a pair of differential amplifiers connected to each other according to the present invention.

DETAILED DESCRIPTION OF THE PREFERRED EMBODIMENTS

FIG. 1 illustrates a conventional gain control circuit in combination with a differential amplifier. The circuit shown includes two power supplies Vcc and Vs, two transistors Q1 and Q2, four resistors $R_1$, $R_2$, $R_3$ and $R_4$, a load resistor $R_5$, an input signal current source 1, a terminal 2, and a variable resistor $R_0$. A first power supply Vcc such as a battery has positive and negative terminals (no numeral). The positive terminal of the first power supply Vcc is connected to a collector of the first transistor Q1 and is further connected via the load resistor R5 to a collector of the second transistor Q2 while the negative terminal of same is grounded. Emitters of first and second transistors $Q_1$ and $Q_2$ are connected to each other and are connected via the input signal current source 1 to ground. The first and third resistors $R_1$ and $R_3$ form a first voltage divider (no numeral) while the second and fourth resistors $R_2$ and $R_4$ form a second voltage divider (no numeral). The first voltage divider is interposed between a positive terminal of the second power source Vs and ground while the second voltage divider is interposed between the positive terminal of same and the terminal 2. Junctions between two resistors $R_1$, $R_3$ and $R_2$, $R_4$ of each voltage dividers are respectively connected to each base of the first and second transistors $Q_1$ and $Q_2$ so that the second power source Vs is utilized for respectively supplying base current thereto. The variable resistor $R_0$ is interposed between the terminal 2 and ground where the movable contact thereof is connected to ground.

The function of the first and second voltage dividers is to provide a predetermined voltage to the base of the first transistor $Q_1$ and a variable voltage to the base of the second transistor $Q_2$ thereby controlling the gain of the differential amplifier. As the movable contact of the variable resistor $R_0$ moves, the reistance between the terminal 2 and ground varies and thus the DC voltage at the base of the second transistor $Q_2$ varies while the other voltage at the base of the first transistor $Q_1$ does not vary so that the amplification degree of the second transistor changes.

Assuming the resistances of the first to fourth resistors $R_1$ to $R_4$ are $R_1$ to $R_4$ and the resistance of the variable resistor $R_0$ varies between O and $R_0$, the voltage difference $\Delta V$ between two bases of the first and second transistors $Q_1$ and $Q_2$ can be expressed by the following equation (1) when the base currents are not considered:

$$\Delta V = \frac{R_4 + nR_0}{R_2 + R_4 + nR_0} V_s - \frac{R_3}{R_1 + R_3} V_s \quad (1)$$

wherein,
n is a variable factor between 0 and 1, and
Vs is a DC voltage of the second power supply Vs.

The output voltage obtained across the load resistor R5 varies in accordance with the magnitude of the voltage difference $\Delta V$, as well known. In the circuit shown in FIG. 1, when the resistance between the terminal 2 and the movable contact of the variable resistor $R_0$ is adjusted to its maximum, the voltage difference $\Delta V$ is also becomes maximum and thus the output of the differential amplifier is maximized accordingly. On the other hand, in case of adjusting the resistance of the variable resistor $R_0$ to its minimum, the voltage difference $\Delta V$ becomes minimal, viz. $-\Delta V$ is maximum. When the resistance of the variable resistor $R_0$ is so adjusted that the voltage difference $\Delta V$ becomes zero, the output voltage of the amplifier is at the half of the available maximum thereof.

Hereinafter, an analysis of the influence of the variation of the variable resistor $R_0$ will be made. It is convenient to let the voltage difference $\Delta V$ equal 0 in order to analyze the influence of the variations of the maximum resistance under the operational condition in which the output of the amplifier is at the half of the maximum.

When $\Delta V = 0$ the following equation (2) is derived from the equation (1):

$$n = \frac{R_2}{R_0} \left( \frac{R_3}{R_1} - \frac{R_4}{R_2} \right) \quad (2)$$

In the above equation (2), the variations of the ratios $R_3/R_1$ and $R_4/R_2$ will be restricted within a narrow range when the IC is made in a regular method while the variations of absolute values of fixed resistors are usually extremely large such as $\pm 20 \sim \pm 30\%$ of the rated value. However, since $R_0$ is the maximum resistance of the variable resistor which is outboardly provided of the IC chip and varies within a range of approximately $\pm 30\%$ of the rated value, the factor $R_2/R_0$ may deviate over $\pm 50\%$ of the rated value.

When a differential amplifier is constructed by discrete elements instead of using an IC, the value of "n" of the equation (2) may still vary within $\pm 35\%$ since the maximum resistance of the variable resistor $R_0$ varies within approximately $\pm 30\%$ of the rated resistance as mentioned hereinabove although the resistances of each fixed resistors $R_1$ to $R_4$ varies within only $\pm 5\%$. Accordingly when the gain control circuit shown in FIG. 1 is used, the movable contact of the variable resistor $R_0$ must be set to a different position in each unit to obtain the same output. In other words, the position of the movable contact of the variable resistor corresponding to a predetermined gain, is not uniform from amplifer to amplifier even though variable resistors which have a predetermined rated maximum resistance are used. Because of the above mentioned variations between the position of the movable contact and the gain, the gain control circuit shown in FIG. 1 is not practical.

As mentioned before, the present invention is achieved to provide a gain control circuit in which the gain of a differential amplifier is controlled irrespectively of the variation of the maximum resistance of the variable resistor.

FIG. 2 illustrates a first preferred embodiment of the gain control circuit in combination with a differential amplifier according to the present invention. The construction of the circuit shown in FIG. 2 is the same as that shown in FIG. 1 except that a variable resistor $R_0$ is interposed between terminals 3 and 4 to which fixed resistors $R_3$ and $R_4$ are respectively connected while the movable contact of the variable resistor $R_0$ is connected to ground. Identical elements are designated by the same numerals as used in FIG. 1. The functions of all of the elements except the variable resistor $R_0$ in the circuit shown in FIG. 2, are the same as those of FIG. 1 and thus the description thereof is omitted.

The two terminals 3 and 4 are provided for connecting an outboard variable resistor $R_0$. The function of the variable resistor $R_0$ is to vary voltages at the terminals 3 and 4 for controlling the gain of the differential amplifier by means of changing the base currents of two transistors $Q_1$ and $Q_2$. A detailed analysis of the function of the variable resistor $R_0$ will be made hereinlater.

FIG. 3 and FIG. 4 respectively illustrate second and third preferred embodiments. The construction of the circuit of the second embodiment shown in FIG. 3 is the same as that shown in FIG. 2 except that the resistors $R_1$ and $R_2$ are grounded while a DC power supply Vs' is interposed between the movable contact of the variable resistor $R_0$ and ground. The construction of the circuit of the third embodiment shown in FIG. 4 is the same as that shown in FIG. 2 except that an additional power supply $V_s'$, the voltage of which is different from that of the power supply $V_s$, is interposed between the movable contact of the variable resistor $R_0$ and ground.

An analysis of the functions of the circuits shown in FIG. 2 to FIG. 4 will be made hereinafter. The voltage difference between two bases of the first and second transistors $Q_1$ and $Q_2$ $\Delta V$ is expressed by the following equation (3):

$$\Delta V = \frac{R_4 + nR_0}{R_2 + R_4 + nR_0} Va - \frac{R_3 + (1-n)R_0}{R_1 + R_3 + (1-n)R_0} Va \quad (3)$$

wherein $R_1$ to $R_4$: resistances of fixed resistors $R_1$ to $R_4$;
$R_0$: resistance between two fixed terminals of the variable resistor $R_0$;
n: variable factor between 0 and 1; and $$Va = v_s - v_s'$$

In the above equation (3), the value of $Va$ equals $V_s$ when the circuit shown in FIG. 2 is used while the value of $Va$ is $-V_s'$ when the circuit shown in FIG. 3 is used since a single power supply $V_s$ or $V_s'$ for supplying base bias voltages is included in these first and second embodiments.

When the voltage difference $\Delta V$ is 0, the output of the differential amplifier is at the half of the maximum. Under this condition, the equation (3) may be expressed in the form of the following equation (4):

$$n = \frac{R_0 R_2 + R_2 R_3 - R_1 R_4}{R_0(R_1 + R_2)} \quad (4)$$

In the above equation (4), if the value of $R_0$ is large enough, viz. considerably larger than those of $R_1$ to $R_4$ (usually more than ten times larger) while the resistances $R_1$ to $R_4$ are comparable with respect to each other, viz. the resistances $R_1$ to $R_4$ are in the substantially same order, the influence of $R_0$ to the value of "n" is negligible whereby the equation (4) can be expressed by the following approximation:

$$n = \frac{R_2}{R_1 + R_2} = \frac{1}{\frac{R_1}{R_2} + 1} \quad (5)$$

On the other hand, if the fixed resistors $R_1$ to $R_4$ are so selected that the following equation (6) is fulfilled, the equation (4) which includes a factor $R_0$ is also expressed by the above equation (5) even though the resistance of the variable resistor $R_0$ is not larger than $R_1$ to $R_4$.

$$(R_1/R_2) = (R_3/R_4) \ldots \quad (6)$$

From the foregoing it will be understood that the equation (4) can be simplified when at least one of two above mentioned conditions is fulfilled.

The equation (5) shows that the value of "n" is determined irrespectively of the value $R_0$. Since the ratio of the fixed resistors $R_1$ and $R_2$ expressed by $R_1/R_2$ have relatively small variation with respect to the variation of the variable resistor $R_0$ as mentioned before, the value of "n" which indicates the dividing ratio of the variable resistor $R_0$, varies within a relatively small range such as $\pm 1 \sim \pm 5\%$. Namely, the half of the maximum output voltage is obtained across the load resistor $R_5$ when the dividing ratio is selected in accordance with the equation (5). Therefore, the position of the movable contact of the variable resistor $R_0$ for obtaining the half of the maximum output voltage is almost uniform from amplifier to amplifier despite the use of variable resistors which have different maximum resistances. This relationship between the gain and the position of the movable contact of the variable resistor holds for all values of the gain of the differential amplifier.

Reference is now made to FIG. 5 which shows a fourth preferred embodiment according to the present invention. The circuit shown includes four transistors $Q_1$ to $Q_4$, two power supplys Vcc and Vs, four resistors $R_1$ to $R_4$, a load resistor $R_5$, and a variable resistor $R_0$ two input signal current sources 1 and 5 and wherein like elements are designated by like numerals as in previous figures.

The base of a third transistor $Q_3$ is connected to the base of the second transistor $Q_2$ while the collector of the third transistor $Q_3$ is connected to the collector of the first transistor $Q_1$. The base of a fourth transistor $Q_4$ is connected to the base of the first transistor $Q_1$ while the collector of the fourth transistor $Q_4$ is connected to the collector of the second transistor $Q_2$. A second input signal source 5 is interposed between ground and emitters of the third and fourth transistors $Q_3$ and $Q_4$. Other arrangement of the circuit shown in FIG. 5 is the same as that of the first preferred embodiment shown in FIG. 2.

Resistors $R_1$ and $R_3$ constitute a first voltage divider while resistors $R_2$ and $R_4$ constitute a second voltage divider between the positive terminal of the second power source Vs and respective terminals 3 and 4. A junction of the first voltage divider is connected to bases of the first and fourth transistors $Q_1$ and $Q_4$ while a junction of the other (second) voltage divider is connected to the bases of second and third transistors $Q_2$ and $Q_3$. The variable resistor $R_0$ is connected to the terminals 3 and 4 where the movable contact thereof is connected to ground. With this arrangement, the bias voltages of first to fourth transistors $Q_1$ to $Q_4$ are controlled by adjusting the movable contact of the variable resistor $R_0$ in the same manner as in the first embodiment shown in FIG. 2.

From the foregoing, it will be apparent that the relationship between the position of the movable contact of the variable resistor $R_0$ and the gain of the two differential amplifiers is uniform irrespective of the maximum resistance of the variable resistor $R_0$ in the same manner as the previously described embodiments. In other words, two predetermined gains are obtained by two differential amplifiers when the movable contact is set at a predetermined position thereof even though the maximum resistance of the variable resistor has a considerable deviation from a rated resistance.

Although in the circuit shown in FIG. 5 a power supply Vs for supplying bias voltages is connected to the first and second resistors $R_1$ and $R_2$ in the same manner as in the first embodiment as shown in FIG. 2, the arrangement of the power supply can be changed as shown in FIG. 3 and FIG. 4.

One of the input signal current sources 1 and 5 can be a DC signal current source while the other signal source is one the magnitude of which is to be controlled. Then the operation of the gain control circuit will be stable in view of DC bias voltages.

When both of the input signal sources 1 and 5 are AC signals, an output voltage across the load resistor $R_5$ will be a composite signal which is obtained by adding two vectors of the input AC signals. The composition ratio of two vectors is controlled in accordance with the position of the movable contact of the variable resistor $R_0$.

In case of supplying a sound signal in the form of the AC input signal, the gain control circuit such as shown in FIGS. 2 to 5 will be utilized as a sound volume control circuit. However, the application of the gain control circuit according to the present invention is not limited to such a volume control circuit. The gain control circuit can be adopted to various kinds of gain controls in many and various technical fields.

As the active elements semiconductor transistors are employed in the above described first to fourth embodiments. However, other active elements such as field effect transistors and tubes may be alternatively employed.

What is claimed is:

1. A gain control circuit in combination with a differential amplifier comprising:

first and second transistors, the first controlled electrodes of which are connected to each other and to ground via an input signal current source, the second controlled electrode of said first transistor being connected to a power source while the second controlled electrode of said second transistor is connected via a load resistor to said power source;

first and second voltage dividers connected to each other at one terminal thereof for receiving a first predetermined voltage while the other terminals of said first and second voltage dividers are respectively connected to first and second terminals, each of said first and second voltage dividers including at least two fixed resistors connected in series at a junction, the junctions of said first and second voltage dividers respectively connected to the control electrodes of said first and second transistors for supplying bias voltages thereto; and a variable resistor for controlling the gain of said differential amplifier, having two fixed terminals and a movable contact, said two terminals being respectively connected to said first and second terminals while the movable contact is fed with a second predetermined voltage, the maximum resistance of said variable resistor is of a value substantially greater than the resistance of each of said fixed resistors whereby any variation of the maximum resistance of the variable resistor has a negligible influence upon the gain of said differential amplifier.

2. A gain control circuit in combination with a differential amplifier comprising:

first and second transistors, the first controlled electrodes of which are connected to each other and to ground via an input signal current source, the second controlled electrode of said first transistor being connected to a power source while the second controlled electrode of said second transistor is connected via a load resistor to said power source;

first and second voltage dividers connected to each other at one terminal thereof for receiving a first predetermined voltage while the other terminals of said first and second voltage dividers are respectively connected to first and second terminals, each of said first and second voltage dividers including at least two fixed resistors connected in series at a junction, the junctions of said first and second voltage dividers respectively connected to the control electrodes of said first and second transistors for supplying bias voltage thereto, the resistances of said fixed resistors being such that a resistance ratio of said first voltage divider equals a corresponding resistance ratio of said second voltage divider; and a variable resistor for controlling the gain of said differential amplifier, having two fixed terminals and a movable contact, said two terminals being respectively connected to said first and second terminals while the movable contact is fed with a second predetermined voltage.

3. A gain control circuit in combination with a differential amplifier comprising:

first and second transistors the first controlled electrodes of which are connected to each other and to ground via an input signal current source, the second controlled electrode of said first transistor being connected to a power source while the second controlled electrode of said second transistor is connected via a load resistor to said power source;

first and second voltage dividers connected to each other at one terminal therof for receiving a first predetermined voltage while the other terminals of said first and second voltage dividers are respectively connected to first and second terminals, each of said first and second voltage dividers including at least two fixed resistors connected in series at a junction, the junctions of said first and second voltage dividers respectively connected to the control electrodes of said first and second transistors for supplying bias voltages thereto the resistances of said fixed resistors being so determined that a resistance ratio of said first voltage divider equals a corresponding resistance ratio of said second voltage divider; and a variable resistor for controlling the gain of said differential amplifier, having two fixed terminals and a movable contact, said two terminals being respectively connected to said first and second terminals while the movable contact is fed with a second predetermined voltage, the maximum resistance of said variable resistor being of a value substantially greater than the resistance of each of said fixed resistors whereby the variation of the maximum resistance of the variable resistor has negligible influence upon the gain of said differential amplifier.

4. A gain control circuit as claimed in any one of claims 1 to 3, further comprising third and fourth transistors the first controlled electrodes of which are connected to each other and to ground via a second input signal current source, the second controlled electrodes of said third and fourth transistors being respectively connected to the second controlled electrodes of said first and second transistors while the control electrodes of said third and fourth transistors are respectively connected to the control electrodes of said first and second transistors.

5. A gain control circuit as claimed in claim 4, wherein said another input signal current source is a DC power supply.

6. A gain control circuit as claimed in any one of claims 1 to 3, wherein said first predetermined voltage is supplied by a power source while said second predetermined voltage is at ground potential.

7. A gain control circuit as claimed in any one of claims 1 to 3, wherein said first predetermined voltage is at ground potential while said second predetermined voltage is supplied by a power source.

8. A gain control circuit as claimed in any one of claims 1 to 3, wherein said first predetermined voltage is supplied by a first power source while said second predetermined voltage is supplied by a second power source the voltage of which is different from that of said first power source.

* * * * *